(12) United States Patent
Yamamoto

(10) Patent No.: US 6,228,749 B1
(45) Date of Patent: May 8, 2001

(54) METHOD OF MANUFACTURING SEMICONDUCTOR DEVICE

(75) Inventor: Ichiro Yamamoto, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/064,066

(22) Filed: Apr. 22, 1998

(30) Foreign Application Priority Data

Apr. 23, 1997 (JP) .................................................. 9-105805

(51) Int. Cl.$^7$ .................................................. H01L 21/20
(52) U.S. Cl. ..................... 438/482; 438/513; 438/597; 438/618; 438/478; 257/298; 257/52; 427/38
(58) Field of Search .................................... 438/482, 513, 438/597, 618, 478; 427/38; 257/298, 52

(56) References Cited

U.S. PATENT DOCUMENTS

| | | | |
|---|---|---|---|
| 5,084,413 | * 1/1992 | Fujita et al. | 437/189 |
| 5,352,291 | * 10/1994 | Zhang et al. | 117/8 |
| 5,385,863 | 1/1995 | Tatsumi et al. | 437/109 |
| 5,424,244 | * 6/1995 | Zhang et al. | 437/173 |
| 5,554,566 | * 9/1996 | Lur et al. | 437/193 |
| 5,854,095 | * 12/1998 | Kang et al. | 438/255 |
| 5,899,725 | * 5/1999 | Harshfield | 438/398 |
| 5,981,974 | * 11/1999 | Makita | 257/72 |
| 6,008,101 | * 12/1999 | Tanata et al. | 438/308 |

FOREIGN PATENT DOCUMENTS

| | | |
|---|---|---|
| 2 313 231 | 11/1997 | (GB) . |
| 2 313 477 | 11/1997 | (GB) . |
| 2 314 683 | 1/1998 | (GB) . |
| 5-304273 | 11/1993 | (JP) . |
| 6-21390 | 1/1994 | (JP) . |
| 8-306646 | 11/1996 | (JP) . |

* cited by examiner

Primary Examiner—Matthew Smith
Assistant Examiner—Granville D Lee
(74) Attorney, Agent, or Firm—Sughrue, Mion, Zinn, Macpeak & Seas, PLLC

(57) ABSTRACT

In manufacturing a semiconductor device, an amorphous silicon layer with a predetermined thickness to be electrically connected to a silicon substrate is formed on a silicon oxide film formed on the silicon substrate. Nuclei are formed on the surface of the amorphous silicon layer by irradiation of a predetermined material while the amorphous silicon layer is annealed at the first temperature. Convexities are formed on the surface of the amorphous silicon layer using the nuclei as centers while the amorphous silicon layer having the nuclei is annealed at the second temperature lower than the first temperature.

8 Claims, 2 Drawing Sheets

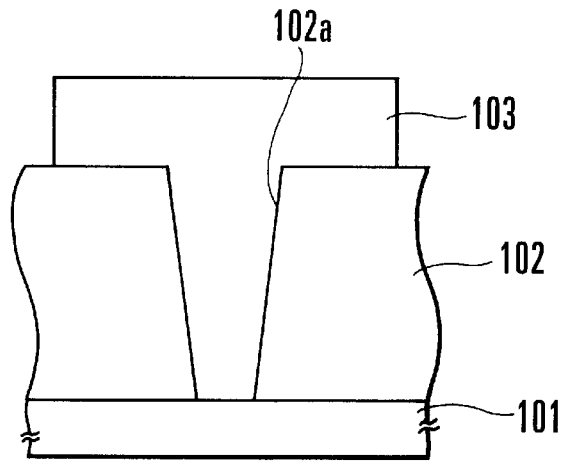
F I G. 1 A
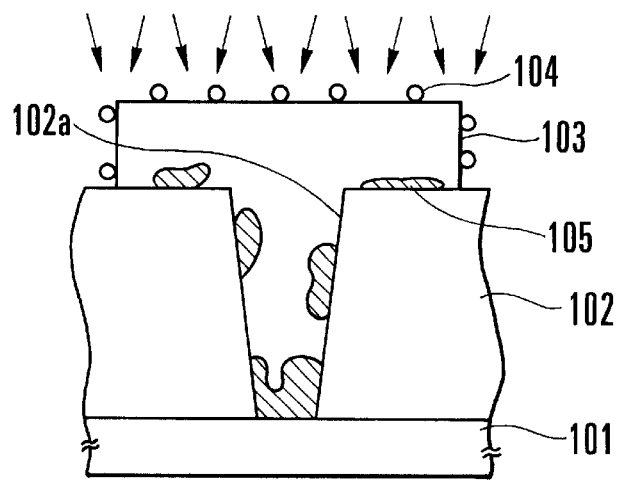
F I G. 1 B
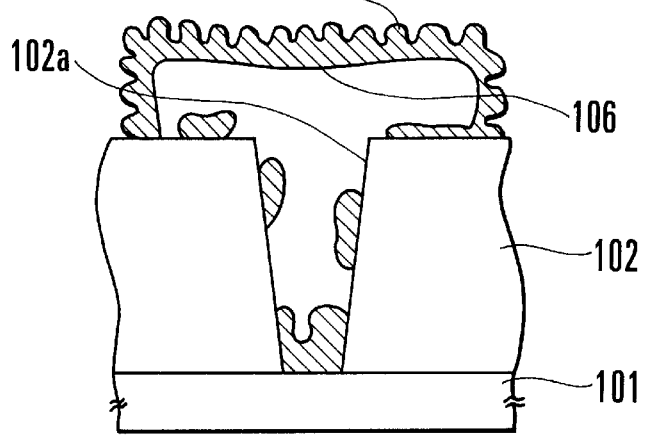
F I G. 1 C

METHOD OF MANUFACTURING SEMICONDUCTOR DEVICE

BACKGROUND OF THE INVENTION

The present invention relates to a method of manufacturing a semiconductor device such as a capacitor element incorporated in a semiconductor device and, more particularly, to a method of manufacturing a semiconductor device using an HSG (Hemi-Spherical-Grain) technique.

In the manufacture of dynamic random access memories (DRAMs) and the like, a higher integration degree has conventionally been required. To meet this requirement, an area necessary for each memory cell in the DRAM is greatly reduced. For example, in a 1- or 4-Mbit DRAM, a design rule using a minimum design width of 0.8 µm is employed; in a 16-Mbit DRAM, a design rule using a minimum design width of 0.6 µm is employed.

While the memory capacity increases in this manner, the semiconductor chip size cannot be increased in terms of high manufacturing efficiency and low cost. How to reduce a memory cell area is therefore an important theme in such semiconductor techniques.

A reduction in memory cell area results in a small charge storage amount. For this reason, it is becoming difficult to ensure a necessary charge amount of the memory cell along with an increase in integration degree of the memory cell. To solve this problem, memory cells having trench capacitors and stacked capacitors have conventionally been proposed and used in practical applications.

Of these memory cells, the memory cell having a stacked capacitor is advantageous in that its structure has high resistance to software errors and does not damage an Si substrate, compared to the structure of the memory cell having a trench capacitor. The memory cell structure having a stacked capacitor is expected as a next-generation memory cell structure.

The memory cell structure having a stacked capacitor is formed by an HSG technique in which a plurality of convexities are formed on the surface of a capacitor element to increase the charge storage amount.

The stacked capacitor is made up of a lower electrode, a capacitor insulating film, and an upper electrode. The lower electrode is electrically connected through a contact hole formed in an interlevel insulating film to a MOSFET (Metal Oxide Semiconductor Field Effect Transistor) formed in a semiconductor substrate. In this case, many hemispherical grains are formed on the surface of a storage electrode operating as the lower electrode of the capacitor to substantially increase the surface area of the storage electrode and obtain a large capacitance.

Several types of HSG technique are available. Of these techniques, so-called nucleation of forming nuclei by irradiation of $SiH_4$ or the like on an amorphous silicon surface and forming convexities by annealing is proposed.

FIGS. 2A to 2C show the steps in manufacturing a capacitor element by a conventional nucleation method. As shown in FIG. 2A, after a capacitor contact hole 2a is formed in an Si oxide film 2 made of BPSG (BoroPhosphoSilicate Glass) or the like on an Si substrate 1, doped amorphous silicon containing phosphorus at a concentration of 1E20 to 1E21 $cm^{-3}$ is grown and formed into a stack shape (to be referred to as an amorphous silicon stack hereinafter) 3 by lithography and etching.

As shown in FIG. 2B, after the amorphous silicon stack 3 is cleaned to remove a native oxide film formed on its surface, the obtained structure is heated to 570° C. in an HSG processing apparatus (not shown) and irradiated with disilane ($Si_2H_6$) at 1 mTorr for 40 sec to form nuclei 4 on the surface of the amorphous silicon stack 3.

As shown in FIG. 2C, the obtained structure is annealed in a high vacuum at 570° C. for 2 min upon the irradiation of disilane, thereby forming hemispherical or mushroom-like HSG grains 7 on the surface of the amorphous silicon stack 3. By the annealing, a crystallized layer 6 is internally grown from the surface of the amorphous silicon stack 3, whereas a crystallized layer 5 is grown from the interface between the Si oxide film 2 and the amorphous silicon stack 3.

If this annealing is continuously performed, the crystallized layer 5 may reach the crystallized layer 6 before the HSG grains 7 completely grow. Once the crystallized layer 5 reaches the crystallized layer 6, subsequent HSG processing stops, and an ungrown portion 10 of the HSG grain 7 may be formed, as shown in FIG. 2C.

For this reason, a method of suppressing the growth of the crystallized layer 5 by decreasing the annealing temperature has conventionally been adopted.

With a decrease in annealing temperature, however, the kinetic energy of Si atoms in the amorphous silicon surface decreases, and surface diffusion hardly occurs. As a result, the growth of HSG grains is also suppressed. In addition, since the temperature range optimal to the growth of HSG grains is narrow, the annealing temperature inside the HSG processing apparatus is difficult to uniformly control at high precision.

SUMMARY OF THE INVENTION

It is an object of the present invention to provide a semiconductor device manufacturing method of suppressing the growth of a crystallized layer. is another object of the present invention to provide a semiconductor device manufacturing method capable of efficiently forming convexities on an amorphous silicon surface.

In order to achieve the above objects, according to the present invention, there is provided a method of manufacturing a semiconductor device, comprising the steps of forming an amorphous silicon layer with a predetermined thickness to be electrically connected to a silicon substrate, on a silicon oxide film formed on the silicon substrate, forming a nucleus on a surface of the amorphous silicon layer by irradiation of a predetermined material while annealing the amorphous silicon layer at a first temperature, and forming a convexity on the surface of the amorphous silicon layer using the nucleus as a center while annealing the amorphous silicon layer having the nucleus at a second temperature lower than the first temperature.

BRIEF DESCRIPTION OF THE DRAWINGS

FIGS. 1A to 1C are sectional views respectively showing the steps in manufacturing a semiconductor device according to an embodiment of the present invention.

DESCRIPTION OF THE PREFERRED EMBODIMENT

Figure 2A:
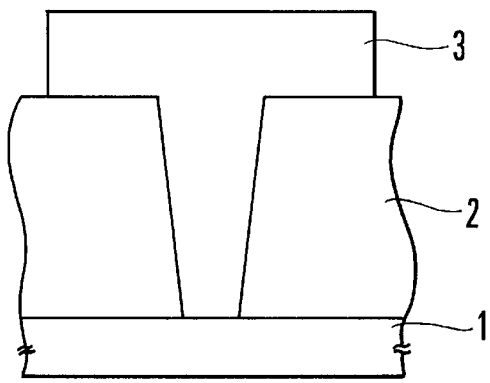
FIGS. 2A to 2C are sectional views respectively showing the steps in manufacturing a conventional semiconductor device.
Figure 2B:
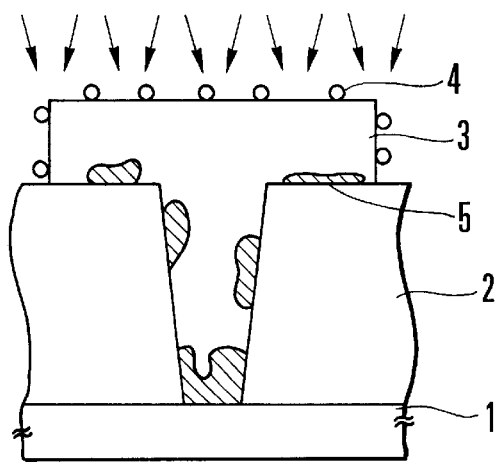
Figure 2C:
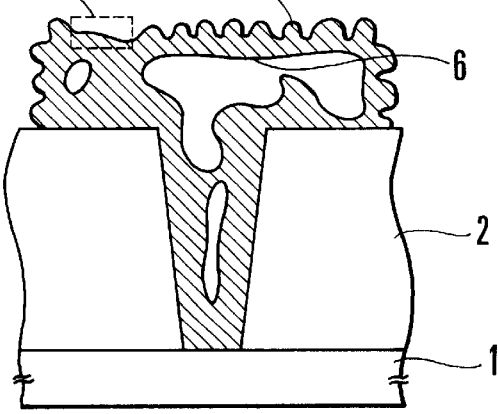

The present invention will be described in detail below with reference to the accompanying drawings.

FIGS. 1A to 1C show the steps in manufacturing a DRAM according to an embodiment of the present invention. Referring to FIG. 1A, a capacitor contact hole 102a is formed in an Si oxide film 102 made of BPSG or the like on an Si substrate 101 so as to reach the Si substrate 101. Doped amorphous silicon containing phosphorus at a concentration of 1E20 to 1E21 cm$^{-3}$ is grown and formed into an amorphous silicon stack 103 with a predetermined thickness above the contact hole 102a and on the peripheral portion of the contact hole 102a by lithography and etching.

At this time, the amorphous silicon stack 103 is also buried in the contact hole 102a. In this embodiment, the thickness of the Si oxide film 102 is 600 nm, the opening diameter of the capacitor contact hole 102a is 400 nm, and the diameter of the bottom surface is 200 nm.

As shown in FIG. 1B, the amorphous silicon stack 103 is cleaned with HF (hydrogen fluoride) or the like to remove a native oxide film formed on its surface. Then, the obtained structure is heated to 550 to 570° C. (preferably 570° C.) in an HSG processing apparatus (not shown) and irradiated with disilane ($Si_2H_6$) at 1 mTorr for 40 sec to form HSG nuclei 104 on the amorphous silicon stack 103.

As shown in FIG. 1C, after the temperature inside the HSG processing apparatus is decreased to a lower temperature (preferably 500° C.) than an amorphous silicon crystallization temperature of 300 to 550° C., i.e., a lower temperature by 10 to 70° C. than the formation temperature (550 to 570° C.) of the nuclei 104, the obtained structure is exposed to an Ar or $N_2$ plasma and annealed for 1 to 5 min. As a result, many hemispherical or mushroom-like convexities, i.e., many HSG grains 107 using the nuclei 104 as centers are formed on the surface of the amorphous silicon stack 103.

Note that the plasma gas is not limited to Ar or $N_2$ gas. As far as the plasma gas is a gas inert to silicon, any gas can be employed except for oxygen or hydrogen gas which reacts with silicon.

By this annealing, a crystallized layer 106 is formed from the surface of the amorphous silicon stack 103 toward the center. Since the temperature is decreased to 500° C., the growth rate of the crystallized layer 106 is low, and the crystallized layer 106 does not reach a crystallized layer 105 before the growth of the HSG grains 107 completes. The plasma conditions are a frequency of 13.56 MHz or 2.45 GHz, a pressure of 0.01 to 1 Torr, and an atmosphere of gas (Ar gas, $N_2$ gas, or the like) which hardly reacts with silicon.

The above embodiment has exemplified the method of manufacturing a capacitor element in a DRAM. The present invention is not limited to the DRAM and is applicable to surface processing to a floating gate and the like in an EPROM (Electrically Programmable ROM) and an EEPROM (Electrically Erasable Programmable ROM).

In the present invention, the plasma is used to apply a kinetic energy to Si atoms forming the nuclei 104. If the same effects are obtained, the present invention is not limited to the plasma, and an ion beam, an electron beam, or the like is available.

As has been described above, according to the present invention, in the step of forming convexities, amorphous silicon is exposed to a plasma at a lower temperature than the temperature in the step of forming nuclei. While the growth of the crystallized layer in the amorphous silicon is suppressed, a kinetic energy can be applied to Si atoms in the amorphous silicon surface. Therefore, convexities can be satisfactorily grown on the amorphous silicon surface.

What is claimed is:

1. A method of manufacturing a semiconductor device, comprising the steps of:

forming an amorphous silicon layer with a predetermined thickness to be electrically connected to a silicon substrate, on a silicon oxide film formed on said silicon substrate;

forming a nucleus on a surface of said amorphous silicon layer by irradiation of a predetermined material while annealing said amorphous silicon layer at a first temperature; and forming a convexity on said surface of said amorphous silicon layer using said nucleus as a center by annealing said amorphous silicon layer having said nucleus at a second temperature lower than said first temperature while exposing said surface of said amorphous silicon layer to a gas plasma which is inert to silicon.

2. A method according to claim 1, wherein the step of forming said amorphous silicon layer comprises the steps of:

forming a contact hole in said silicon oxide film so as to reach said silicon substrate; and forming said amorphous silicon layer with a predetermined thickness above said contact hole and on said silicon oxide film around the contact hole.

3. A method according to claim 1, wherein the convexity formed on said surface of said amorphous silicon layer has one of a hemispherical shape or a mushroom-like shape.

4. A method according to claim 1, wherein the gas plasma inert to silicon is an argon or nitrogen plasma.

5. A method according to claim 1, wherein the first temperature is set to 550 to 570° C.

6. A method according to claim 1, wherein the second temperature is set lower by 10 to 70° C. than the first temperature.

7. A method of manufacturing a semiconductor device, comprising the steps of:

forming an amorphous silicon layer with a predetermined thickness to be electrically connected to a silicon substrate, on a silicon oxide film formed on said silicon substrate;

forming a nucleus on a surface of said amorphous silicon layer by irradiation of a predetermined material while annealing said amorphous silicon layer at a first temperature; and forming a convexity on said surface of said amorphous silicon layer using said nucleus as a center by annealing said amorphous silicon layer having said nucleus at a second temperature lower than the first temperature while irradiating said surface of said amorphous silicon layer with an ion beam.

8. A method of manufacturing a semiconductor device, comprising the steps of:

forming an amorphous silicon layer with a predetermined thickness to be electrically connected to a silicon substrate, on a silicon oxide film formed on said silicon substrate;

forming a nucleus on a surface of said amorphous silicon layer by irradiation of a predetermined material while annealing said amorphous silicon layer at a first temperature; and forming a convexity on said surface of said amorphous silicon layer using said nucleus as a center by annealing said amorphous silicon layer having said nucleus at a second temperature lower than the first temperature while irradiating said surface of said amorphous silicon layer with an electron beam.

* * * * *